United States Patent
Freer et al.

(10) Patent No.: US 8,522,801 B2
(45) Date of Patent: *Sep. 3, 2013

(54) METHOD AND APPARATUS FOR CLEANING A SEMICONDUCTOR SUBSTRATE

(75) Inventors: Erik M. Freer, Campbell, CA (US); John M. deLarios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 650 days.

This patent is subject to a terminal disclaimer.

(21) Appl. No.: 11/612,371

(22) Filed: Dec. 18, 2006

(65) Prior Publication Data
US 2007/0084485 A1    Apr. 19, 2007

Related U.S. Application Data

(63) Continuation-in-part of application No. 10/608,871, filed on Jun. 27, 2003, now abandoned.

(60) Provisional application No. 60/755,377, filed on Dec. 30, 2005.

(51) Int. Cl.
*B08B 3/00* (2006.01)

(52) U.S. Cl.
USPC .................................................. 134/93; 15/3

(58) Field of Classification Search
None
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |

(Continued)

FOREIGN PATENT DOCUMENTS

| DE | 40-38-587 | 6/1992 |
|---|---|---|
| EP | 0827188 | 3/1998 |

(Continued)

OTHER PUBLICATIONS

Aubert, JM et al.; "Aqueous foams"; Scientific America; 1986, 74-82, 254.

(Continued)

*Primary Examiner* — Eric Golightly
(74) *Attorney, Agent, or Firm* — Martine Penilla Group, LLP

(57) ABSTRACT

A method for cleaning a substrate is provided. The method initiates with disposing a fluid layer having solid components therein to a surface of the substrate. A shear force directed substantially parallel to the surface of the substrate and toward an outer edge of the substrate is then created. The shear force may result from a normal or tangential component of a force applied to a solid body in contact with the fluid layer in one embodiment. The surface of the substrate is rinsed to remove the fluid layer. A cleaning system and apparatus are also provided.

6 Claims, 7 Drawing Sheets

(56) References Cited

U.S. PATENT DOCUMENTS

| | | | |
|---|---|---|---|
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | 134/122 R |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | 134/7 |
| 5,242,669 A | 9/1993 | Flor | 423/465 |
| 5,271,774 A | 12/1993 | Leenaars et al. | 134/31 |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,542,982 A * | 8/1996 | Terada et al. | 134/5 |
| 5,656,097 A | 8/1997 | Olesen et al. | 134/1 |
| 5,660,642 A | 8/1997 | Britten | 134/30 |
| 5,705,223 A | 1/1998 | Bunkofske | 427/240 |
| 5,800,626 A | 9/1998 | Cohen et al. | 134/1.3 |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,906,021 A | 5/1999 | Coffey | |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | 431/39 |
| 5,944,582 A | 8/1999 | Talieh | 451/41 |
| 5,945,351 A | 8/1999 | Mathuni | 438/706 |
| 5,951,779 A | 9/1999 | Koyanagi et al. | 134/2 |
| 5,964,954 A | 10/1999 | Matsukawa et al. | 134/6 |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | 134/2 |
| 6,048,409 A | 4/2000 | Kanno et al. | 134/34 |
| 6,049,996 A | 4/2000 | Freeman et al. | 34/362 |
| 6,081,650 A | 6/2000 | Lyons et al. | 386/95 |
| 6,090,217 A | 7/2000 | Kittle | 134/11 |
| 6,092,538 A | 7/2000 | Arai et al. | 134/1.3 |
| 6,152,805 A | 11/2000 | Takahashi | 451/36 |
| 6,158,445 A | 12/2000 | Olesen et al. | 134/1.3 |
| 6,167,583 B1 | 1/2001 | Miyashita et al. | 15/77 |
| 6,190,238 B1 * | 2/2001 | Tanaka et al. | 451/41 |
| 6,228,563 B1 | 5/2001 | Starove et al. | 430/327 |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | 15/77 |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | 134/6 |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | 451/57 |
| 6,398,975 B1 | 6/2002 | Mertens et al. | 216/92 |
| 6,401,734 B1 | 6/2002 | Morita et al. | 134/153 |
| 6,423,148 B1 | 7/2002 | Aoki | 134/3 |
| 6,431,959 B1 * | 8/2002 | Mikhaylich et al. | 451/41 |
| 6,439,247 B1 | 8/2002 | Kittle | 134/102.1 |
| 6,457,199 B1 | 10/2002 | Frost et al. | 15/77 |
| 6,491,043 B2 | 12/2002 | Mohindra et al. | 134/25.4 |
| 6,491,764 B2 | 12/2002 | Mertens et al. | 134/36 |
| 6,493,902 B2 | 12/2002 | Lin | 15/302 |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotikis | 134/6 |
| 6,532,976 B1 | 3/2003 | Huh et al. | 134/111 |
| 6,537,915 B2 | 3/2003 | Moore et al. | 438/692 |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | 15/102 |
| 6,596,093 B2 | 7/2003 | DeYoung et al. | |
| 6,616,772 B2 | 9/2003 | de Larios et al. | 134/21 |
| 6,705,930 B2 * | 3/2004 | Boyd et al. | 451/286 |
| 6,733,596 B1 | 5/2004 | Mikhaylichenko et al. | 134/6 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | 134/28 |
| 6,846,380 B2 | 1/2005 | Dickinson et al. | 156/354.31 |
| 6,851,435 B2 | 2/2005 | Mertens et al. | 134/99.1 |
| 6,874,516 B2 | 4/2005 | Matsuno et al. | 134/148 |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | 216/689 |
| 2001/0012751 A1 * | 8/2001 | Boyd et al. | 451/41 |
| 2002/0072482 A1 | 6/2002 | Sachdev et al. | 510/175 |
| 2002/0081945 A1 * | 6/2002 | Kistler et al. | 451/9 |
| 2002/0094684 A1 | 7/2002 | Hirasaki et al. | 438/689 |
| 2002/0121290 A1 | 9/2002 | Tang et al. | 134/6 |
| 2002/0185164 A1 | 12/2002 | Tetsuka et al. | 134/148 |
| 2002/0195121 A1 | 12/2002 | Kittle | 134/3 |
| 2003/0075204 A1 | 4/2003 | de Larios et al. | 134/21 |
| 2003/0148903 A1 | 8/2003 | Bargaje et al. | 510/130 |
| 2003/0171239 A1 | 9/2003 | Patel et al. | 510/406 |
| 2003/0226577 A1 | 12/2003 | Orll et al. | 134/1.3 |
| 2004/0002430 A1 | 1/2004 | Verhaverbeke | 510/175 |
| 2004/0053808 A1 | 3/2004 | Raehse et al. | 510/447 |
| 2004/0134515 A1 | 7/2004 | Castrucci | 134/2 |
| 2004/0159335 A1 | 8/2004 | Montierth et al. | 134/10 |
| 2004/0163681 A1 | 8/2004 | Verhaverbeke | 134/28 |
| 2004/0261823 A1 | 12/2004 | de Larios | 134/31 |
| 2005/0045209 A1 | 3/2005 | Tan | 134/18 |
| 2005/0132515 A1 | 6/2005 | Boyd et al. | 15/77 |
| 2005/0133060 A1 | 6/2005 | de Larios et al. | 134/1.3 |
| 2005/0133061 A1 | 6/2005 | de Larios et al. | 134/6 |
| 2005/0159322 A1 | 7/2005 | Min et al. | 510/175 |
| 2005/0176606 A1 | 8/2005 | Konno et al. | 510/175 |
| 2005/0183740 A1 | 8/2005 | Fulton et al. | 134/3 |
| 2006/0201267 A1 | 9/2006 | Liu | 74/89.2 |
| 2006/0283486 A1 | 12/2006 | de Larios et al. | 134/34 |
| 2006/0285930 A1 | 12/2006 | de Larios et al. | 406/197 |
| 2007/0000518 A1 | 1/2007 | Korolik et al. | |

FOREIGN PATENT DOCUMENTS

| | | |
|---|---|---|
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |

| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam Wafer Cleaning and Drying the Future?" <http://www.aquafoam.com/papers/SCI0202.pdf>; Semiconductor, 25, #2, Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collnge, Dublin; 1999.

Kittle, et al.; "Photoresist Residue Removal Using Aqueous Foam Proof of Concept Experiments"; Internet; http://www.aquafoam.com/paper/Proof-11MB.pdf;<papers/A2C2photoresis.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

\* cited by examiner

METHOD AND APPARATUS FOR CLEANING A SEMICONDUCTOR SUBSTRATE

CROSS REFERENCE TO RELATED APPLICATIONS

This application claims the benefit of U.S. Provisional Application No. 60/755,377, filed Dec. 30, 2005. Additionally, this application is a continuation-in-part of prior application Ser. No. 10/608,871, filed Jun. 27, 2003, now abandoned and entitled "Method and Apparatus for Removing a Target Layer From a Substrate Using Reactive Gases." The disclosure of each of the above-identified applications is incorporated herein by reference for all purposes. This application is related to U.S. patent application Ser. No. 10/816,337, filed on Mar. 31, 2004, and entitled "Apparatuses and Methods for Cleaning a Substrate," and U.S. patent application Ser. No. 11/173,132, filed on Jun. 30, 2005, and entitled "System and Method for Producing Bubble Free Liquids for Nanometer Scale Semiconductor Processing," and U.S. patent application Ser. No. 11/153,957, filed on Jun. 15, 2005, and entitled "Method and Apparatus for Cleaning a Substrate Using Non-Newtonian Fluids," and U.S. patent application Ser. No. 11/154,129, filed on Jun. 15, 2005, and entitled "Method and Apparatus for Transporting a Substrate Using Non-Newtonian Fluid," and U.S. patent application Ser. No. 11/174,080, filed on Jun. 30, 2005, and entitled "Method for Removing Material from Semiconductor Wafer and Apparatus for Performing the Same," and U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," and U.S. patent application Ser. No. 11/336,215 filed on Jan. 20, 2006, and entitled "Method and Apparatus for Removing Contamination from Substrate," U.S. patent application Ser. No. 11/346,894 filed on Feb. 3, 2006 and entitled "Method for Removing Contamination from a Substrate and for Making a Cleaning Solution," U.S. patent application Ser. No. 11/347,154 filed on Feb. 3, 2006 and entitled "Cleaning Compound and Method and System for Using the Cleaning Compound," U.S. patent application Ser. No. 11/532,491 filed on Sep. 15, 2006 and entitled "Method and material for cleaning a substrate," U.S. patent application Ser. No. 11/532,493 filed on Sep. 15, 2006 and entitled "Apparatus and system for cleaning a substrate." The disclosure of each of these related applications is incorporated herein by reference for all purposes.

BACKGROUND

In the fabrication of semiconductor devices, such as integrated circuits, memory cells, and the like, a series of manufacturing operations are performed to define features on semiconductor wafers. The wafers include integrated circuit devices in the form of multi-level structures defined on a silicon substrate. At a substrate level, transistor devices with diffusion regions are formed. In subsequent levels, interconnected metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially, any material present in a manufacturing operation is a potential source of contamination. For example, sources of contamination may include process gases, chemicals, deposition materials, and liquids, among others. The various contaminants may deposit on the surface of a wafer as particulate matter. If the particulate contamination is not removed, the devices within the vicinity of the contamination will likely be inoperable. Thus, it is necessary to clean contamination from the wafer surface in a substantially complete manner without damaging the features defined on the wafer. The size of particulate contamination is often on the order of critical dimension size of the features being fabricated on the wafer. Removal of such small particulate contamination without adversely affecting the features on the wafer can be a challenge.

Conventional wafer cleaning methods have relied heavily on mechanical force to remove particulate contamination from the wafer. As feature size continues to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination that may cause damage. Particulate contamination of sufficiently small size can find its way into difficult-to-reach areas on the wafer surface, such as in a trench surrounded by high-aspect ratio features or bridging of conductive lines, etc. Thus, efficient and non-damaging removal of contaminants during marred and semiconductor fabrication represents continuous challenge to be met by continuing advances in wafer cleaning technology. It should be appreciated that the manufacturing operations for flat panel displays suffer from the same shortcomings of the integrated circuit manufacturing discussed above. Thus, any technology requiring contaminant removal is in need of a more effective and less-abrasive cleaning technique.

SUMMARY

Broadly speaking, the present invention fills these needs by providing an improved cleaning technique and cleaning solution. It should be appreciated that the present invention can be implemented in numerous ways, including as a system, an apparatus and a method. Several inventive embodiments of the present invention are described below.

In one embodiment, a method for cleaning a substrate is provided. The method initiates with disposing a fluid layer having solid components therein to a surface of the substrate. A shear force directed substantially parallel to the surface of the substrate and toward an outer edge of the substrate is then created. The shear force may result from a normal or tangential component of a force applied to a solid body in contact with the fluid layer in one embodiment. The surface of the substrate is rinsed to remove the fluid layer.

In another embodiment, a cleaning apparatus for cleaning a substrate is provided. The cleaning apparatus includes a force transferring entity having an outer surface in contact with a fluid disposed on a surface of the substrate. The fluid has solid components and the force transferring entity is configured to force the solid components toward the surface of the substrate. The apparatus includes a substrate support configured to support the substrate under the force transferring entity.

In yet another embodiment, a cleaning system for cleaning a substrate is provided. The cleaning system includes a fluid reservoir configured to deliver a fluid having solid components to a surface of a substrate. The system includes a force transferring entity having an outer surface configured to contact the fluid disposed on the surface of the substrate. The force transferring entity is configured to provide a force having a normal component to thin a fluid layer defined between a bottom surface of one of the solid components and the surface of the substrate. The system includes a substrate support configured to support the substrate under the force transferring entity.

Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The embodiments described herein provide for a cleaning technique that reduces the abrasive contact and is efficient at cleaning contaminants from a semiconductor substrate which may contain high aspect ratio features. It should be appreciated that while the embodiments provide specific examples related to semiconductor cleaning applications, these cleaning applications may be extended to any technology requiring the removal of contaminants from a surface. The embodiments described herein provide a force to a cleaning agent to thin a fluid layer between the cleaning agent and a contaminant on the surface of the substrate being cleaned. In on exemplary embodiment, the cleaning agent is a solid material that interacts with the contaminant to subsequently remove the contaminant. In another embodiment, the force having a normal component relative to a surface of the substrate causes a fluid layer defined between the bottom surface of the cleaning agent and a top surface of the contaminant to thin. This thinning in turn causes a sheer force that is substantially parallel to the surface of the substrate to force the contaminant toward an outer edge of the substrate. In essence, the contaminant becomes entrained in the fluid flow defined by the shear force which is a consequence of the force having the normal component.

Figure 1A:
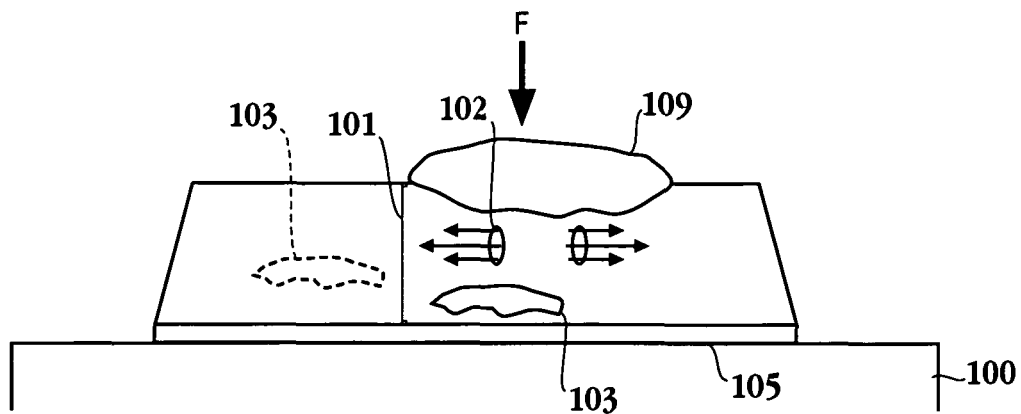
FIG. 1A is a simplified schematic diagram illustrating a technique for removing contaminants from a substrate surface in accordance with one embodiment of the invention.

FIG. 1A is a simplified schematic diagram illustrating a technique for removing contaminants from a substrate surface in accordance with one embodiment of the invention. By providing a down force (F) a solid material 109 is forced toward a top surface of substrate 105. While forcing the solid component 109 toward the top surface of wafer 105 through the normal component of down force F the channel of fluid defined between the bottom surface of solid 109 and the top of wafer surface 105 becomes thinner and thinner. As a result of this thinning of fluid layer 101 under solid 109, a parabolic velocity profile develops in fluid layer 101, which may be also referred to as a lubrication layer. In one embodiment, fluid layer 101 is a viscoelastic fluid, i.e., a fluid that exhibits both viscous and elastic characteristics. In one embodiment, this parabolic velocity profile illustrated by arrows 102 provides a shear force in order to dislodge contaminant 103. This shear force will move contaminant 103 from its original position disposed on wafer 105 to facilitate complete removal the contaminant and clean the wafer surface. As will be described in more detail below, down force F is applied through a force transferring entity. Wafer 105 is placed upon chuck 100. One skilled in the art will appreciate that wafer 105 may be clamped to chuck 100 through known techniques. It should be appreciated that the embodiments described herein are not limited to substrate 105 being placed upon a chuck as illustrated in FIG. 1A. That is, alternative embodiments, such as placing substrate 105 on a conveyor, pad, or any other suitable transport mechanism or support structure that accommodates the cleaning techniques described herein is possible.

Figure 1B:
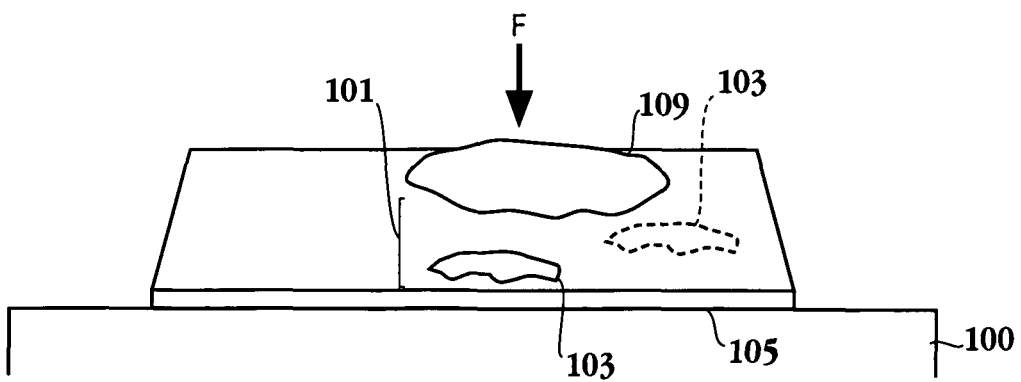
FIG. 1B in is a simplified schematic diagram illustrating the thinning of fluid layer, which may be referred to as a fluid channel, from FIG. 1A in accordance with one embodiment of the invention.

FIG. 1B is a simplified schematic diagram illustrating the thinning of fluid layer 101, which may be referred to as a fluid channel, from FIG. 1A in accordance with one embodiment of the invention. In FIG. 1B, the normal component of down force F pushes solid 109 closer to a top surface of substrate 105. As solid 109 is pushed closer to the top of substrate surface 105, layer/channel 101 becomes thinner and thinner. Consequently, the velocity towards the outer ends of substrate 105 increases and provides a greater shear force to dislodge contaminant 103 from the top surface of substrate 105. It should be appreciated that as fluid layer 101 becomes thinner, the required down force F becomes greater to further thin this layer. As will be described in more detail below, a force transferring entity pushing on the top surface of solid 109 may be any suitable material capable of providing a force having a normal component to solid 109. Such examples include flexible and compliant types of material which are non-reactive to the material used herein such as rubber components, e.g., latex, etc., metal discs, shaped membranes, etc., as will be described further below. As used herein, solid 109 may be referred to as a persistent coupling element (PCE). In referring to solid 109 as a persistent coupling element, the characteristic of remaining or persisting throughout a cleaning operation is provided, as opposed to cleaning solutions having a relatively short existence, such as bubbles, which may cavitate and then no longer persist. In one embodiment, the fluid pressed between the membrane and the wafer in fluid layer 101, includes a wetting agent or surfactant. In another embodiment, the fluid includes a carboxylic acid component which remains undissolved in the fluid. That is, the carboxylic acid component may be represented by solid 109. In one embodiment, solid 109 is a crystal that has a triclinic structure. In the triclinic structure, the crystal is described by vectors of unequal length. In addition, all three vectors are not mutually orthogonal. In yet another embodiment, the membrane providing force upon the fluid above substrate 105 is softer than layers on the substrate, free of materials which may scratch or otherwise damage films on the substrate, i.e., stack films such as silicon dioxide, silicon nitride, silicon, copper, aluminum, etc. In one embodiment, the membrane may contain cleaning fluid which can permeate through the membrane in controlled amounts. Alternatively, the membrane balloon may be sealed and impermeable. One skilled in the art will appreciate that solid 109 of FIGS. 1A and 1B may be dispersed in a fluid that is the same fluid as fluid layer 101.

Figure 2A:
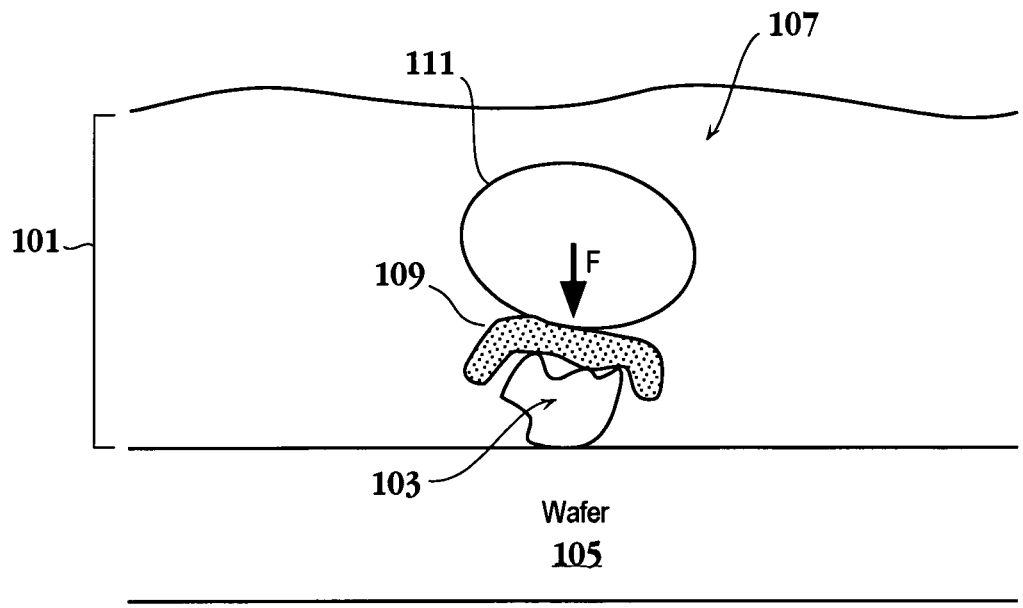
FIGS. 2A and 2B are illustrations showing how the cleaning material functions to remove the contaminant from the wafer, in accordance with one embodiment of the present invention.
Figure 2B:
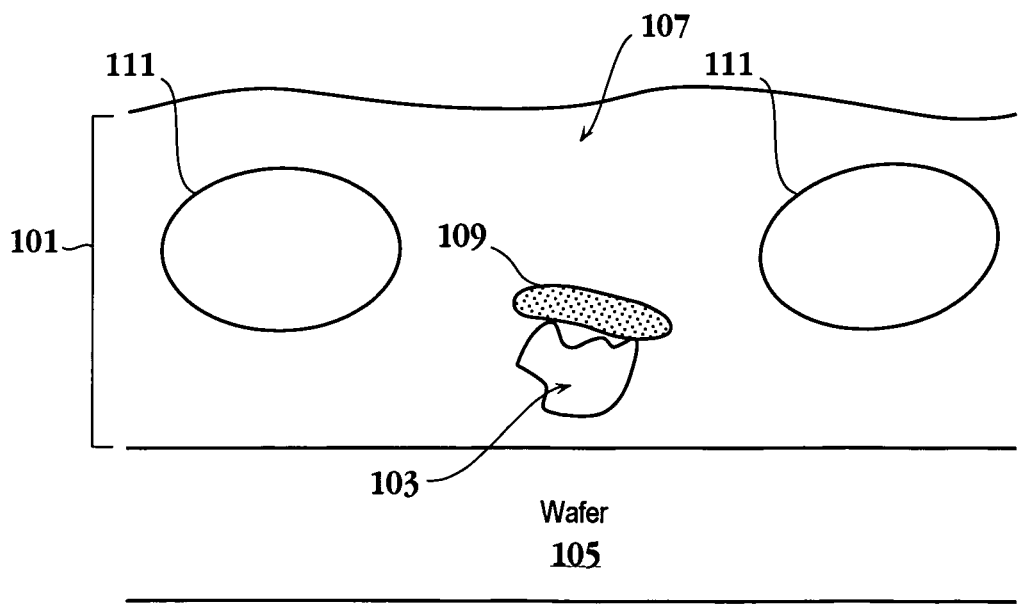

FIGS. 2A and 2B are illustrations showing how the cleaning material 101 functions to remove the contaminant 103 from the wafer 105, in accordance with one embodiment of the present invention. It should be understood that the cleaning material 101 depicted in FIGS. 2A-2B is further defined in U.S. application Ser. No. 11/346,894, which has been incorporated by reference. As shown in FIG. 2A, within the liquid medium 107 of the cleaning material 101, the solid component 109 is interposed between the contaminant 103 and the immiscible component 111. The immiscible component 111 within the liquid medium 107, whether gas bubbles or liquid droplets, has an associated surface tension. Therefore, when the immiscible component 111 is pressed downward against the solid component 109, the immiscible component 111 becomes deformed and exerts a downward force (F) having a normal component on the solid component 109. This downward force (F), or a normal component of F, serves to move the solid component 109 toward the wafer 105 and contaminant 103 thereon. In one embodiment, the interaction between the solid component 109 and contaminant 103 occurs when the solid component 109 is forced sufficiently close to the contaminant 103. In one embodiment, this distance may be within about 10 nanometers. In another embodiment, the interaction between the solid component 109 and contaminant 103 occurs when the solid component 109 actually contacts the contaminant 103. This interaction may also be referred to as solid component 109 engaging contaminant 103. Of course, the thinning of the fluid layer may force contaminant from the substrate surface through the shear forces resulting from the thinning.

The interaction force between the solid component 109 and the contaminant 103 is stronger than the force connecting the contaminant 103 to the wafer 105. Additionally, in an embodiment where the solid component 109 binds with the contaminant 103, a force used to move the solid component 109 away from the wafer 105 is stronger than the force connecting the contaminant 103 to the wafer 105. Therefore, as depicted in FIG. 2B, when the solid component 109 is moved away from the wafer 105, the contaminant 103 bound to the solid component 109 is also moved away from the wafer 105 It should be appreciated that because the solid components 109 interact with the contamination 103 to affect the cleaning process, contamination 103 removal across the wafer 105 will be dependent on how well the solid components 109 are distributed across the wafer 105. In a preferred embodiment, the solid components 109 will be so well distributed that essentially every contaminant 103 on the wafer 105 will be in proximity to at least one solid component 109. It should also be appreciated that one solid component 109 may come in contact with or interact with more than one contaminant 103, either in a simultaneous manner or in a sequential manner. Furthermore, solid component 109 may be a mixture of different components as opposed to all the same component. Thus, the cleaning solution is capable of being designed for a specific purpose, i.e., targeting a specific contaminant, or the cleaning solution can have a broad spectrum of contaminant targets where multiple solid components are provided.

Interaction between the solid component 109 and the contaminant 103 can be established through one or more mechanisms including adhesion, collision, and attractive forces, among others. Adhesion between the solid component 109 and contaminant 103 can be established through chemical interaction and/or physical interaction. For example, in one embodiment, chemical interaction causes a glue-like effect to occur between the solid component 109 and the contaminant 103. In another embodiment, physical interaction between the solid component 109 and the contaminant 103 is facilitated by the mechanical properties of the solid component 109. For example, the solid component 109 can be malleable such that when pressed against the contaminant 103, the contaminant 103 becomes imprinted within the malleable solid component 109. In another embodiment, the contaminant 103 can become entangled in a network of solid components 109. In this embodiment, mechanical stresses can be transferred through the network of solid components 109 to the contaminant 103, thus providing the mechanical force necessary for removal of the contaminant 103 from the wafer 105.

Deformation of the solid component 109 due to imprinting by the contaminant 103 creates a mechanical linkage between the solid component 109 and the contaminant 103. For example, a surface topography of the contaminant 103 may be such that as the contaminant 103 is pressed into the solid component 109, portions of the solid component 109 material enters regions within the surface topography of the contaminant 103 from which the solid component 109 material cannot easily escape, thereby creating a locking mechanism. Additionally, as the contaminant 103 is pressed into the solid component 109, a vacuum force can be established to resist removal of the contaminant 103 from the solid component 109.

In another embodiment, energy transferred from the solid component 109 to the contaminant 103 through direct or indirect contact may cause the contaminant 103 to be dislodged from the wafer 105. In this embodiment, the solid component 109 may be softer or harder than the contaminant 103. If the solid component 109 is softer than the contaminant 103, greater deformation of the solid component 109 is likely to occur during the collision, resulting in less transfer of kinetic energy for dislodging the contaminant 103 from the wafer 105. However, in the case where the solid component 109 is softer than the contaminant 103, the adhesive connection between the solid component 109 and the contaminant 103 may be stronger. Conversely, if the solid component 109 is at least as hard as the contaminant 103, a substantially complete transfer of energy can occur between the solid component 109 and the contaminant 103, thus increasing the force that serves to dislodge the contaminant 103 from the wafer 105. However, in the case where the solid component 109 is at least as hard as the contaminant 103, interaction forces that rely on deformation of the solid component tO9 may be reduced. It should be appreciated that physical properties and relative velocities associated with the solid component 109 and the contaminant 103 will influence the collision interaction there between.

In addition to the foregoing, in one embodiment, interaction between the solid component 109 and contaminant 103 can result from electrostatic attraction. For example, if the solid component 109 and the contaminant 103 have opposite surface charges they will be electrically attracted to each other. It is possible that the electrostatic attraction between the solid component 109 and the contaminant 103 can be sufficient to overcome the force connecting the contaminant 103 to the wafer 105.

In another embodiment, an electrostatic repulsion may exist between the solid component 109 and the contaminant 103. For example, both the solid component 109 and the contaminant 103 can have either a negative surface charge or a positive surface charge. If the solid component 109 and the contaminant 103 can be brought into close enough proximity, the electrostatic repulsion there between can be overcome through van der Waals attraction. The force applied by the immiscible component 111 to the solid component 109 may be sufficient to overcome the electrostatic repulsion such that van der Waals attractive forces are established between the solid component 109 and the contaminant 103. Additionally, in another embodiment, the pH of the liquid medium 107 can be adjusted to compensate for surface charges present on one or both of the solid component 109 and contaminant 103, such that the electrostatic repulsion there between is reduced to facilitate interaction, or so that either the solid component or the contamination exhibit surface charge reversal relative to the other resulting in electrostatic attraction.

Figure 3:
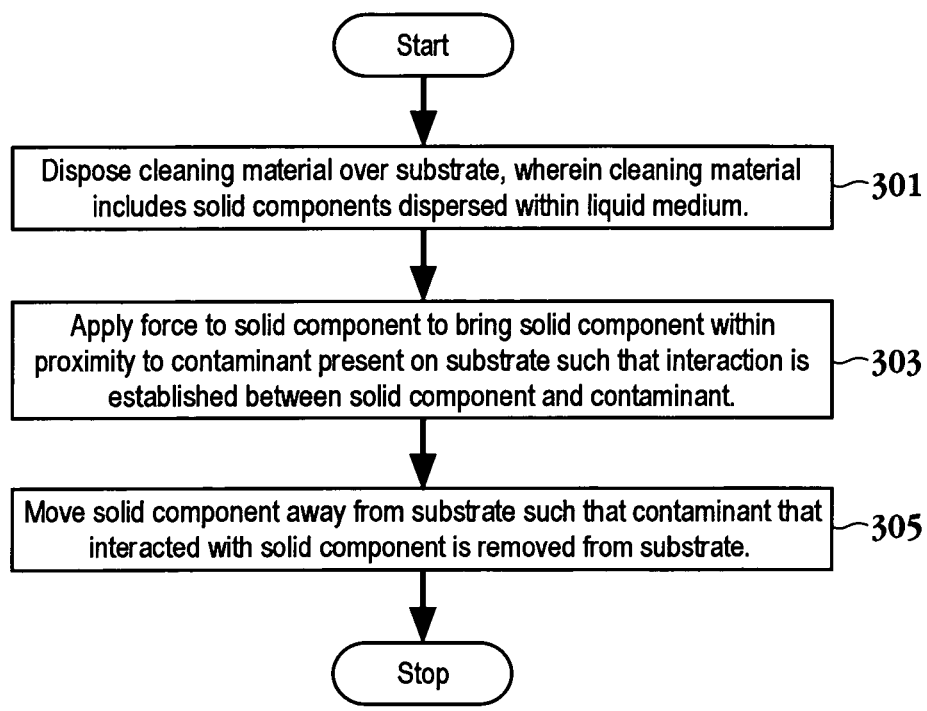
FIG. 3 is an illustration showing a flowchart of a method for removing contamination from a substrate, in accordance with one embodiment of the present invention.

FIG. 3 is an illustration showing a flowchart of a method for removing contamination from a substrate, in accordance with one embodiment of the present invention. It should be understood that the substrate referenced in the method of FIG. 3 can represent a semiconductor wafer or any other type of substrate from which contaminants associated with a semiconductor fabrication process need to be removed. Also, the contaminants referenced in the method of FIG. 3 can represent essentially any type of contaminant associated with the semiconductor wafer fabrication process, including but not limited to particulate contamination, trace metal contamination, organic contamination, photoresist debris, contamination from wafer handling equipment, and wafer backside particulate contamination.

The method of FIG. 3 includes an operation 301 for disposing a cleaning material over a substrate, wherein the cleaning material includes solid components dispersed within a liquid medium. The cleaning material referenced in the method of FIG. 3 is the same as previously described with respect to FIGS. 1A, 1B, 2A, and 2B. Therefore, the solid components within the cleaning material are dispersed in suspension within the liquid medium. Also, the solid components are defined to avoid damaging the substrate and to avoid adherence to the substrate. In one embodiment, the solid components are defined as crystalline solids having a triclinic or needle like structure. In another embodiment, the solid components are defined as non-crystalline solids. In yet another embodiment, the solid components are represented as a combination of crystalline and non-crystalline solids. Additionally, in various embodiments, the liquid medium can be either aqueous or non-aqueous.

The method also includes an operation 303 for applying a force to a solid component to bring the solid component within proximity to a contaminant present on the substrate, such that an interaction is established between the solid component and the contaminant. As previously discussed, immiscible components are provided within the cleaning material to apply the force to the solid component necessary to bring the solid component within proximity to the contaminant. In one embodiment, the method can include an operation for controlling the immiscible components to apply a controlled amount of force to the solid component. The immiscible components can be defined as gas bubbles or immiscible liquid droplets within the liquid medium. Additionally, the immiscible components can be represented as a combination of gas bubbles and immiscible liquid droplets within the liquid medium. Alternatively, the force may be applied to the solid component through the force transferring entities discussed herein.

In one embodiment of the method, the immiscible components are defined within the liquid medium prior to disposing the cleaning material over the substrate. However, in another embodiment, the method can include an operation to form the immiscible components in-situ following disposition of the cleaning material over the substrate. For example, the immiscible components can be formed from a dissolved gas within the liquid medium upon a decrease in ambient pressure relative to the cleaning material. It should be appreciated that formation of the immiscible components in situ may enhance the contamination removal process. For example, in one embodiment, gravity serves to pull the solid components toward the substrate prior to formation of the immiscible components. Then, the ambient pressure is reduced such that gas previously dissolved within the liquid medium comes out of solution to form gas bubbles. Because the solid components have settled by gravity toward the substrate, the majority of gas bubbles will form above the solid components. Formation of the gas bubbles above the solid components, with the solid components already settled toward the substrate, will serve to enhance movement of the solid components to within proximity of the contaminants on the substrate.

In various embodiments, the interaction between the solid component and the contaminant can be established by adhesive forces, collision forces, attractive forces, or a combination thereof. Also, in one embodiment, the method can include an operation for modifying a chemistry of the liquid medium to enhance interaction between the solid component and the contaminant. For example, the pH of the liquid medium can be modified to cancel surface charges on one or both of the solid component and contaminant such that electrostatic repulsion is reduced.

Additionally, in one embodiment, the method can include an operation for controlling a temperature of the cleaning material to enhance interaction between the solid component and the contaminant. More specifically, the temperature of the cleaning material can be controlled to control the properties of the solid component. For example, at a higher temperature the solid component may be more malleable such that it conforms better when pressed against the contaminant. Then, once the solid component is pressed and conformed to the contaminant, the temperature is lowered to make the solid component less malleable to better hold its conformal shape relative to the contaminant, thus effectively locking the solid component and contaminant together. The temperature may also be used to control the solubility and therefore the concentration of the solid components. For example, at higher temperatures the solid component may be more likely to dissolve in the liquid medium. The temperature may also be used to control and/or enable formation of solid components in-situ on the wafer from liquid-liquid suspension.

In a separate embodiment, the method can include an operation for precipitating solids dissolved within the continuous liquid medium. This precipitation operation can be accomplished by dissolving the solids into a solvent and then adding a component that is miscible with the solvent but that does not dissolve the solid. Addition of the component that is miscible with the solvent but that does not dissolve the solid causes the precipitation of a solid component.

The method further includes an operation 305 for moving the solid component away from the substrate such that the contaminant that interacted with the solid component is removed from the substrate. In one embodiment, the method includes an operation for controlling a flow rate of the cleaning material over the substrate to control or enhance movement of the solid component and/or contaminant away from the substrate. The method of the present invention for removing contamination from a substrate can be implemented in many different ways so long as there is a means for applying a force to the solid components of the cleaning material such that the solid components establish an interaction with the contaminants to be removed. It should be noted that while the embodiments described above refer to an immiscible component, the embodiments are not required to have this immiscible component. As described below, a force transferring entity provides a force to the solid components to thin a fluid layer thereby creating a shear force and/or enable the solid components to interact with the contaminants.

Figure 4:
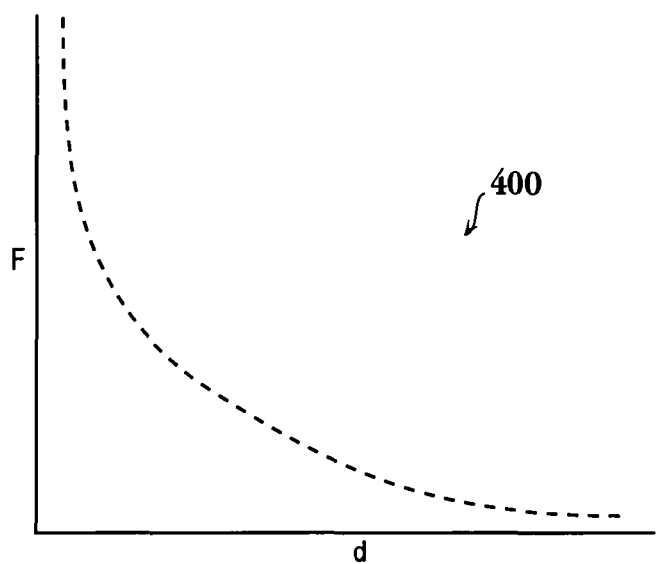
FIG. 4 is a simplified schematic diagram illustrating a graph showing the force and distance relationship according to the embodiments described herein.

FIG. 4 is a simplified schematic diagram illustrating a graph showing the force and distance relationship according to the embodiments described herein. As illustrated in graph 400, as the distance between the solid component 109 and the top of substrate 105 of FIGS. 1A through 2B become smaller the force required to move the solid component closer increases. As the distance becomes smaller and smaller, the fluid between the solid component and the substrate surface become thinner and thinner resulting in the increased shear rate. In addition, while FIGS. 1A, 1B, and 2A illustrate the normal component of down force F, the embodiments are not limited to only a normal force. That is, the applied force has a normal component that can be any proportion greater than 0 of the total force.

Figure 5:
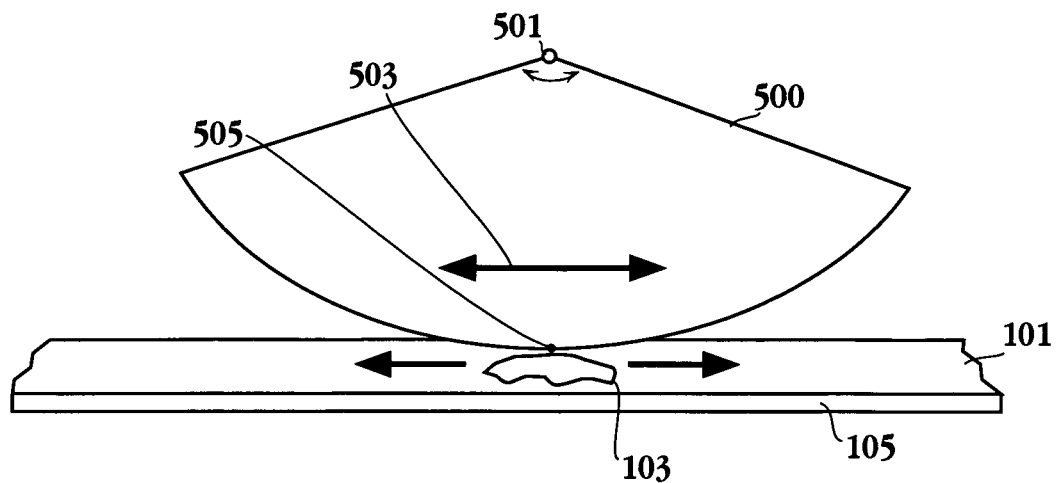
FIG. 5 is a simplified schematic diagram illustrating a technique for cleaning a surface of a substrate with a shaped membrane in accordance with one embodiment of the invention.

FIG. 5 is a simplified schematic diagram illustrating a technique for cleaning a surface of a substrate with a shaped membrane in accordance with one embodiment of the invention. In this embodiment, force transferring entity 500 is provided as a section of a cylinder. Force transferring entity 500 may pivot around pivot point 501 in one embodiment. Alternatively, force transferring entity 500 may move laterally as depicted by arrow 503. Of course, force transferring entity 500 may move both laterally and pivot around pivot point 501. When pivoting around pivot point 501 inflection point 505 remains consistent, as far as the distance from surface of substrate 105. In essence, force transferring entity 500 acts as a pendulum in this embodiment, and the back and forth action will provide compression of the fluid layer 101 in order to dislodge contaminant 103 through the shear force or the interaction. It should be appreciated that substrate 105 may move either laterally or rotationally relative to force transferring entity 500. Of course, both substrate 105 and force transferring entity 500 may be in motion. In another embodiment, force transferring entity 500 may be a planar plate composed of any compatible material. The planar plate provides the force to thin the fluid layer to create the shear forces or to bring the solid proximate to the contaminant to enable an interaction between the two.

Figure 6:
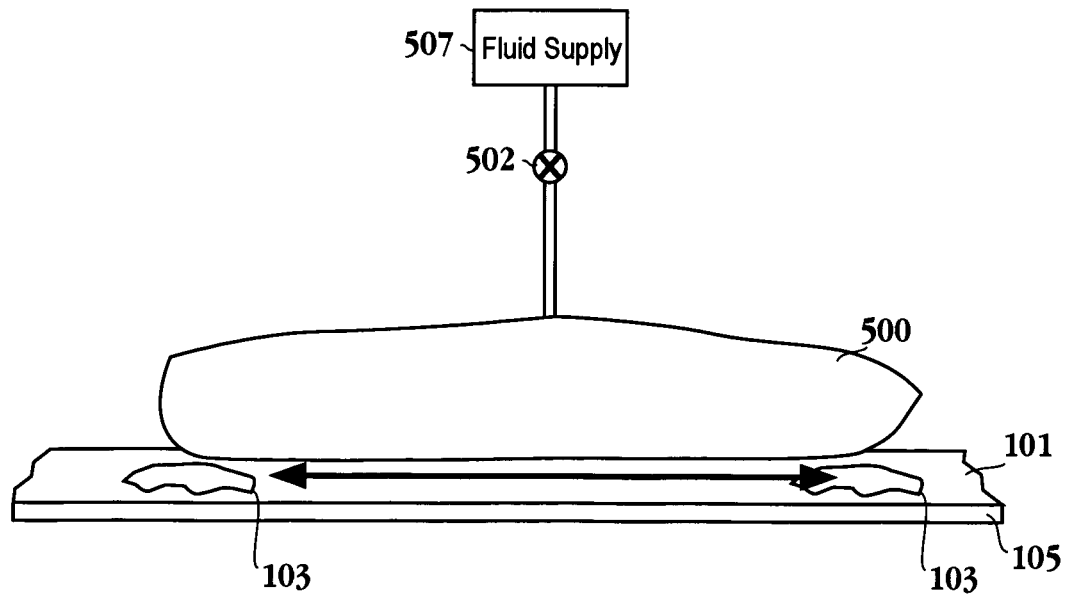
FIG. 6 is a simplified schematic diagram illustrating a compliant membrane used as a force transferring entity in accordance with one embodiment of the invention.

FIG. 6 is a simplified schematic diagram illustrating a compliant membrane used as a force transferring entity in accordance with one embodiment of the invention. Membrane 500 may be embodied by a balloon or some other type of inflatable component in order to provide the force for thinning the fluid layer 101. Fluid supply 507 provides the gas or liquid to inflate/pressurize the force transferring entity through valve 502 into a delivery line which feeds into force transferring entity 500. As force transferring entity 500 is compliant, the force provided over a surface of substrate 105 and to fluid 101 thereon, is evenly distributed. It should be appreciated that force transferring entity 500 in FIG. 6 may cover an entire surface of substrate 105 or cover a portion of the surface of substrate 105 and be moved over the substrate to complete the entire cleaning of substrate 105. Alternatively, substrate 105 may be rotated or linearly moved under force transferring entity 500. The magnitude of the force may be controlled by adjusting the air or liquid pressure inside of force transferring entity 500. In one embodiment, the cleaning fluid may be used to pressurize force transferring entity 500. In this embodiment, force transferring entity 500 may include relatively small orifices on a bottom surface to direct the cleaning fluid onto the top surface of substrate 105. The orifices will be small enough to maintain a pressure gradient to inflate/pressurize force transferring entity 500. In order to facilitate delivery of the cleaning fluid to the surface of substrate 105, the bottom surface of force transferring entity 500 may be ribbed or have protrusions defined thereon to define a gap or open area between the bottom surface of the force transferring entity and the top surface of the substrate. Thus, the cleaning fluid, which includes the solids, will be delivered through the orifices into the gap created by this embodiment. The normal component of the force transferring entity will then function as described above.

Figure 7:
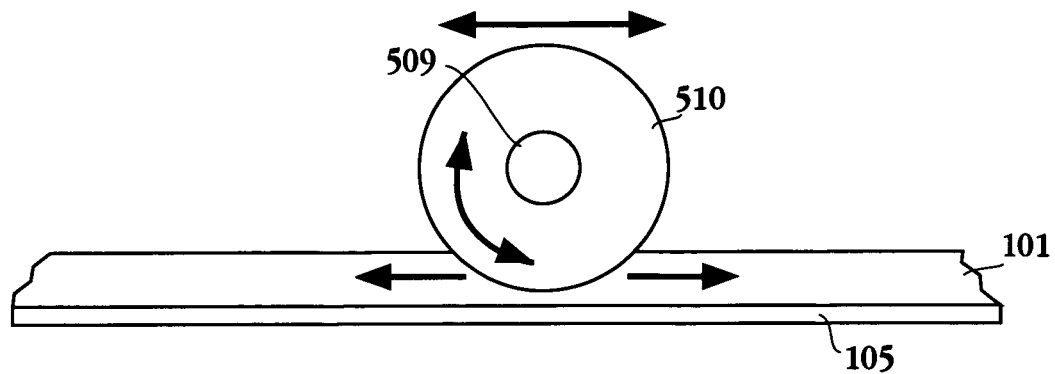
FIG. 7 is a simplified schematic diagram illustrating an embodiment in which the force transferring entity has a cylindrical shape.

FIG. 7 is a simplified schematic diagram illustrating an embodiment in which the force transferring entity has a cylindrical shape. Force transferring entity 510 is used to provide the force necessary to thin fluid layer 101 disposed on substrate 105. Force transferring entity 510 may rotate around axis 509. In another embodiment, force transferring entity 510 may move laterally across a surface of substrate 105. Of course, as mentioned above, the force transferring entity may move both laterally and rotationally in another embodiment. It should be further appreciated that force transferring entity 510 may rock back and forth around axis 509. That is, force transferring entity 510 may rotate a portion of a revolution in one direction, and then rotate back another portion of a revolution in the opposite rotational direction.

Figure 8:
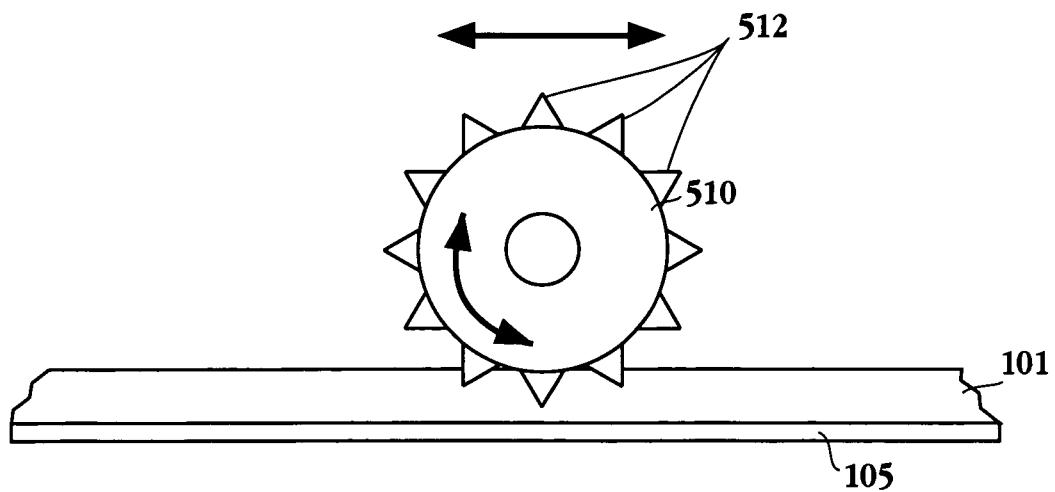
FIG. 8 is a simplified schematic diagram illustrating an alternative embodiment to the force transferring entity of FIG. 7.

FIG. 8 is a simplified schematic diagram illustrating an alternative embodiment to the force transferring entity of FIG. 7. Force transferring entity 510 in FIG. 8 has protrusions 512 which will perturbate, or disturb, the fluid layer as well as thin the fluid layer. Protrusions 512 have triangular shape in FIG. 8, however, this is not meant to be limiting. That is, protrusions 512 may be any suitable geometric shape such as circular, square, cylindrical, baffles, etc. In essence, any configuration in which the fluid layer 101 is perturbated by the protrusions will accomplish the functionality desired in the embodiment represented by FIG. 8. Another way of referring to the embodiment of FIG. 8 is that the outer surface of force transferring entity 5 10 has a texture. It should be appreciated that by providing the perturbations or disturbances to the fluid layer described with regard to FIG. 8, the fluid layer will begin to have solid characteristics from these perturbations and may assist in moving contamination disposed on the surface of substrate 105. As the frequency of the perturbations approach a Deborah number of approximately 0.1 or greater, the fluid begins to act as a solid rather than a liquid. The Deborah number is defined as the ratio of the characteristic time scale of the material i.e., the relaxation time of the molecules in the fluid layer, to the time scale of deformation (frequency of perturbations of the force transferring entity).

Figure 9:
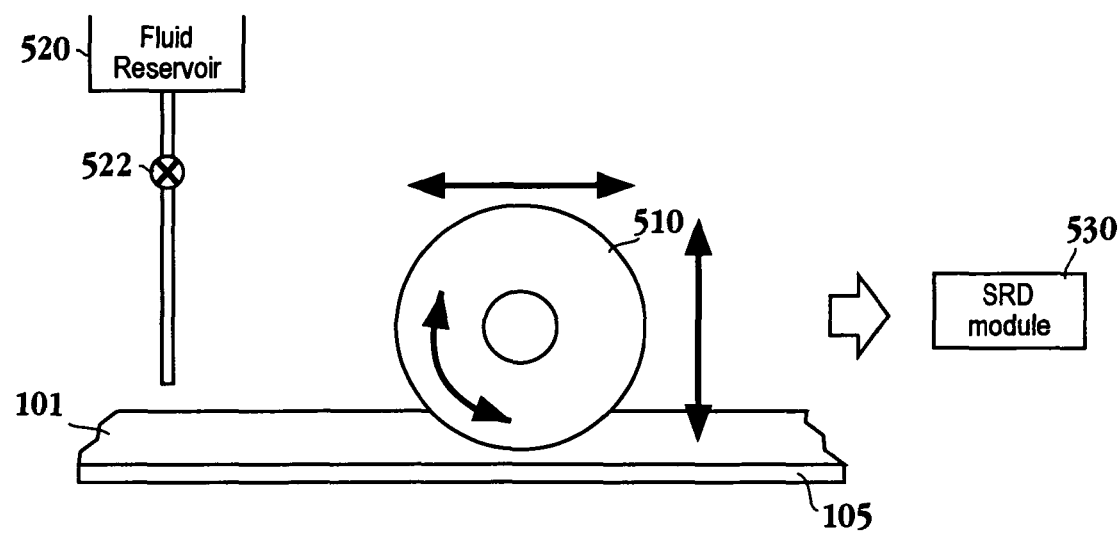
FIG. 9 is a simplified schematic diagram of a system for cleaning a surface of a substrate in accordance with one embodiment of the invention.

FIG. 9 is a simplified schematic diagram of a system for cleaning a surface of a substrate in accordance with one embodiment of the invention. The system includes a fluid reservoir 520 which provides fluid layer 101 on top of substrate 105. In this embodiment, fluid reservoir 520 feeds the fluid through valve 522 onto substrate 105. One skilled in the art will appreciate that numerous other fluid delivery techniques may be applied, such as spraying, puddling, etc. Force transferring entity 510 will then thin fluid layer 101 in order to clean the surface of substrate 105 in accordance with the embodiments described above. As mentioned previously, force transferring entity may rotate or move laterally across a top surface of substrate 105, or some combination of rotation and lateral movement. Force transferring entity 510 is depicted as a roller, however, any of the disclosed embodiments for the force transferring entity may be incorporated here. Once the entire surface of substrate 105 has experienced the cleaning effect, i.e., the downward force to thin the fluid layer 101, substrate 105 may be transferred to a cleaning module, such as spin rinse and dry (SRD) module 530. Alternatively, forced transferring any entity 510 may be removed from surface of substrate 05 by movement in an orthogonal direction relative to a top of substrate 105. The contamination, which may be now attached to solid particles 109 in one embodiment, is washed away in a final clean and rinse step. This clean and rinse step may contain chemicals, such as ammonium hydroxide or a surfactant to facilitate the removal of a fatty acid from the surface of substrate 105, where the cleaning agent within the fluid layer includes a fatty acid, such as carboxylic acid.

Although the present invention has been described in the context of removing contaminants from a semiconductor wafer, it should be understood that the previously described principles and techniques of the present invention can be equally applied to cleaning surfaces other than semiconductor wafers. For example, the present invention can be used to clean any equipment surface used in semiconductor manufacturing, wherein any equipment surface refers to any surface that is in environmental communication with the wafer, e.g., shares air space with the wafer. The present invention can also be used in other technology areas where contamination removal is important. For example, the present invention can be used to remove contamination on parts used in the space program, or other high technology areas such as surface science, energy, optics, microelectronics, MEMS, flat-panel processing, solar cells, memory devices, etc. It should be understood that the aforementioned listing of exemplary areas where the present invention may be used is not intended to represent an inclusive listing. Furthermore, it should be appreciated that the wafer as used in the exemplary description herein can be generalized to represent essentially any other structure, such as a substrate, a part, a panel, etc.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A substrate cleaning system, comprising:
    a fluid reservoir configured to deliver a fluid having solid components to a surface of a substrate;
    a force transferring entity having a compliant membrane disposed over an outer surface, the force transferring entity being one of a bubble or a droplet, the compliant membrane configured to contact the fluid disposed on the surface of the substrate, the force transferring entity configured to provide a force having a normal component to thin a viscoelastic fluid layer defined between a bottom surface of one of the solid components and the surface of the substrate through expansion and contraction of the compliant membrane while contacting the fluid; and
    a substrate support configured to support the substrate under the force transferring entity.

2. The cleaning system of claim 1, wherein the force transferring entity is configured to be pressurized to adjust the expansion and contraction of the compliant membrane.

3. The cleaning system of claim 1, wherein the solid components include a crystal that has a triclinic structure.

4. The cleaning system of claim 1, wherein the support structure is configured to rotate the substrate.

5. The cleaning system of claim 1, wherein the force transferring entity is configured to rotate around an axis and move laterally relative to the surface of the substrate.

6. The cleaning system of claim 1, further comprising:
    a spin rinse and dry system configured to remove the fluid from the surface of the substrate.

* * * * *